(12) United States Patent
Barras et al.

(10) Patent No.: US 7,380,219 B1
(45) Date of Patent: May 27, 2008

(54) METHOD AND APPARATUS FOR IMPLEMENTING A CIRCUIT DESIGN FOR AN INTEGRATED CIRCUIT

(75) Inventors: Arne S. Barras, Longmont, CO (US); Rajeev Jayaraman, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 428 days.

(21) Appl. No.: 11/054,862

(22) Filed: Feb. 10, 2005

(51) Int. Cl.
*G06F 17/50* (2006.01)
(52) U.S. Cl. ................ 716/1; 716/16; 716/18
(58) Field of Classification Search ............ 716/1–2, 716/4–6, 16–18
See application file for complete search history.

(56) References Cited

U.S. PATENT DOCUMENTS 6,018,624 A * 1/2000 Baxter ................... 703/16
6,408,428 B1 * 6/2002 Schlansker et al. ........... 716/17
2002/0023252 A1 * 2/2002 Lee et al. ................. 716/6

\* cited by examiner

*Primary Examiner*—Paul Dinh
(74) *Attorney, Agent, or Firm*—Robert Brush (57) ABSTRACT

Method and apparatus for implementing a circuit design for an integrated circuit is described. In one example, a first version of the circuit design is processed (408) with at least one design tool. Statistical data is captured (410) for the at least one design tool and operational attributes thereof are automatically adjusted (420) in response to the statistical data. A second version of the circuit design is processed (422) with the at least one design tool having the adjusted operational attributes. In another example, the circuit design is processed (506) with at least one design tool in a first iteration. Statistical data is captured (508) for the at least one design tool and operational attributes thereof are automatically adjusted (514) for a second iteration in response to the statistical data of the first iteration. The circuit design is re-processed (516) with the at least one design tool having the adjusted operational attributes in the second iteration.

7 Claims, 5 Drawing Sheets

METHOD AND APPARATUS FOR IMPLEMENTING A CIRCUIT DESIGN FOR AN INTEGRATED CIRCUIT

FIELD OF THE INVENTION

One or more aspects of the present invention relate generally to integrated circuit design tools and, more particularly, to a method and apparatus for implementing a circuit design for an integrated circuit.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (known as a bitstream) into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers.

To implement a circuit design using an FPGA, the design is synthesized to produce a logical representation, which is then mapped onto programmable logic blocks, placed within the FPGA, and routed using the programmable fabric. The place and route phases of implementing a circuit design involve generating a layout of the circuit elements on the FPGA and defining the signal lines (routing resources) that connect the elements.

Presently, the design tools used to implement a circuit design perform their tasks on the user's design without regard to the specifics of the design or to the execution history of the design tools. For example, if a place-and-route tool processes a design to produce a result, all subsequent executions by the place-and-route tool for the same design will produce the same result both in terms of the quality of the result, as well as the execution time taken to achieve the result. Typically, in a design cycle a user will execute the implementation tools several times on different versions of the design. Each successive version may only be slightly different. However, the implementation tools deal with these versions as if they were completely independent and distinct designs despite the fact that these versions may only be slightly different. As such, the results and run-time of the implementation tools of a slightly different version do not leverage the results of the previous version and, therefore, may not show any significant improvement in the quality of results or execution time from version to version.

Accordingly, there exists a need in the art for a method and apparatus for implementing a circuit design for an integrated circuit that takes less time to run while providing improved results.

SUMMARY OF THE INVENTION

Method and apparatus for implementing a circuit design for an integrated circuit is described. In one embodiment, a first version of the circuit design is processed with at least one design tool. Statistical data is captured for the at least one design tool. Operational attributes are automatically adjusted for the at least one design tool in response to the statistical data. A second version of the circuit design is processed with the at least one design tool having the adjusted operational attributes.

In another embodiment, the circuit design is processed with at least one design tool in a first iteration. Statistical data is captured for the at least one design tool. The statistical data may include, for example, design statistics, design performance statistics, statistics on failed user constraints, algorithmic statistics, and global statistics. The statistical data may be captured to a project quality file. Operational attributes of the at least one tool are automatically adjusted for a second iteration in response to the statistical data of the first iteration. The circuit design is re-processed with the at least one design tool having the adjusted operational attributes in the second iteration. For example, the circuit design may be re-processed in the second iteration in order to improve the design performance obtained from the first iteration, or to meet a failed user constraint that occurred during the first iteration.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method and apparatus for implementing a circuit design for an integrated circuit is described. One or more aspects of the invention are described with respect to implementation of a circuit design for an FPGA. Those skilled in the art will appreciate, however, that the present invention may be used to implement circuit designs for other types of programmable logic devices, such as complex programmable logic devices (CPLDs), and other types of integrated circuits, such as application specific integrated circuits (ASICs).

Figure 1:
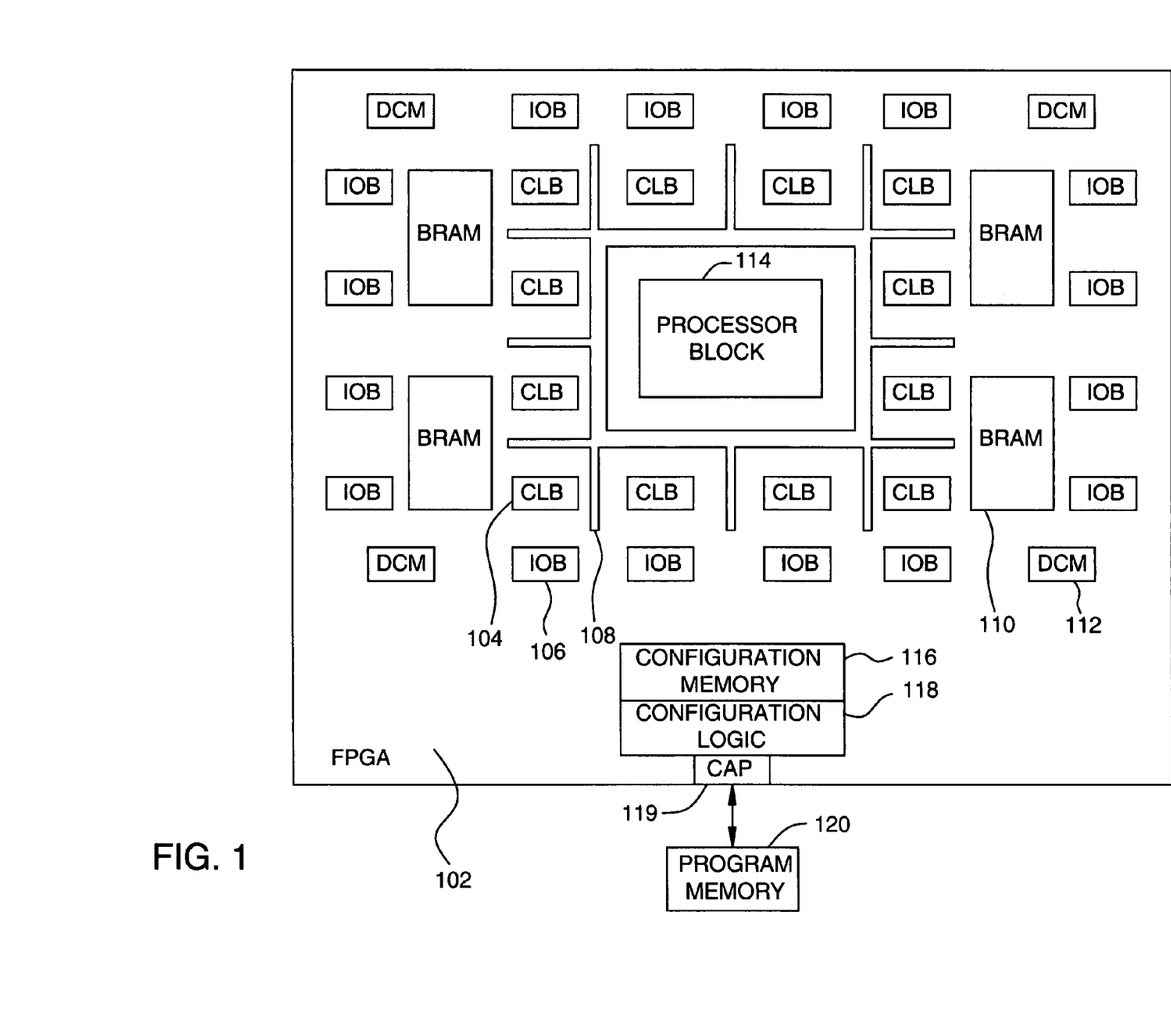
FIG. 1 is a block diagram depicting an exemplary embodiment of an FPGA coupled to a program memory.

FIG. 1 is a block diagram depicting an exemplary embodiment of an FPGA 102 coupled to a program memory 120. The FPGA 102 illustratively comprises programmable logic circuits or "blocks", illustratively shown as CLBs 104, IOBs 106, and programmable interconnect 108 (also referred to as "programmable logic"), as well as configuration memory 116 for determining the functionality of the FPGA 102. The FPGA 102 may also include an embedded processor block 114, as well as various dedicated internal logic circuits, illustratively shown as blocks of random access memory ("BRAM 110"), configuration logic 118, digital clock management (DCM) blocks 112, and input/output (I/O) transceiver circuitry 122. Those skilled in the art will appreciate that the FPGA 102 may include other types of logic blocks and circuits in addition to those described herein.

As is well known in the art, the IOBs 106, the CLBs 104, and the programmable interconnect 108 may be configured to perform a variety of functions. Notably, the CLBs 104 are programmably connectable to each other, and to the IOBs 106, via the programmable interconnect 108. Each of the CLBs 104 may include one or more "slices" and programmable interconnect circuitry (not shown). Each CLB slice in turn includes various circuits, such as flip-flops, function generators (e.g., a look-up tables (LUTs)), logic gates, memory, and like type well-known circuits. The IOBs 106 are configured to provide input to, and receive output from, the CLBs 104.

Configuration information for the CLBs 104, the IOBs 106, and the programmable interconnect 108 is stored in the configuration memory 116. The configuration memory 116 may include static random access memory (SRAM) cells. The configuration logic 118 provides an interface to, and controls configuration of, the configuration memory 116. A configuration bitstream produced from the program memory 120 may be coupled to the configuration logic 118 through a configuration port 119. The configuration process of FPGA 102 is also well known in the art.

The I/O transceiver circuitry 122 may be configured for communication over any of a variety of media, such as wired, wireless, and photonic, whether analog or digital. The I/O transceiver circuitry 122 may comprise gigabit or multi-gigabit transceivers (MGTs). The DCM blocks 112 provide well-known clock management circuits for managing clock signals within the FPGA 102, such as delay lock loop (DLL) circuits and multiply/divide/de-skew clock circuits.

The processor block 114 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic of the FPGA 102 (e.g., CLBs 104, IOBs 106). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art.

The processor block 114 is coupled to the programmable logic of the FPGA 102 in a well known manner. For purposes of clarity by example, the FPGA 102 is illustrated with 12 CLBs, 16 IOBs, 4 BRAMs, 4 DCMs, and one processor block. Those skilled in the art will appreciate that actual FPGAs may include one or more of such components in any number of different ratios. For example, the FPGA 102 may be selected from the VIRTEX-II PRO family of products, commercially available from Xilinx, Inc. of San Jose, Calif.

Figure 2:
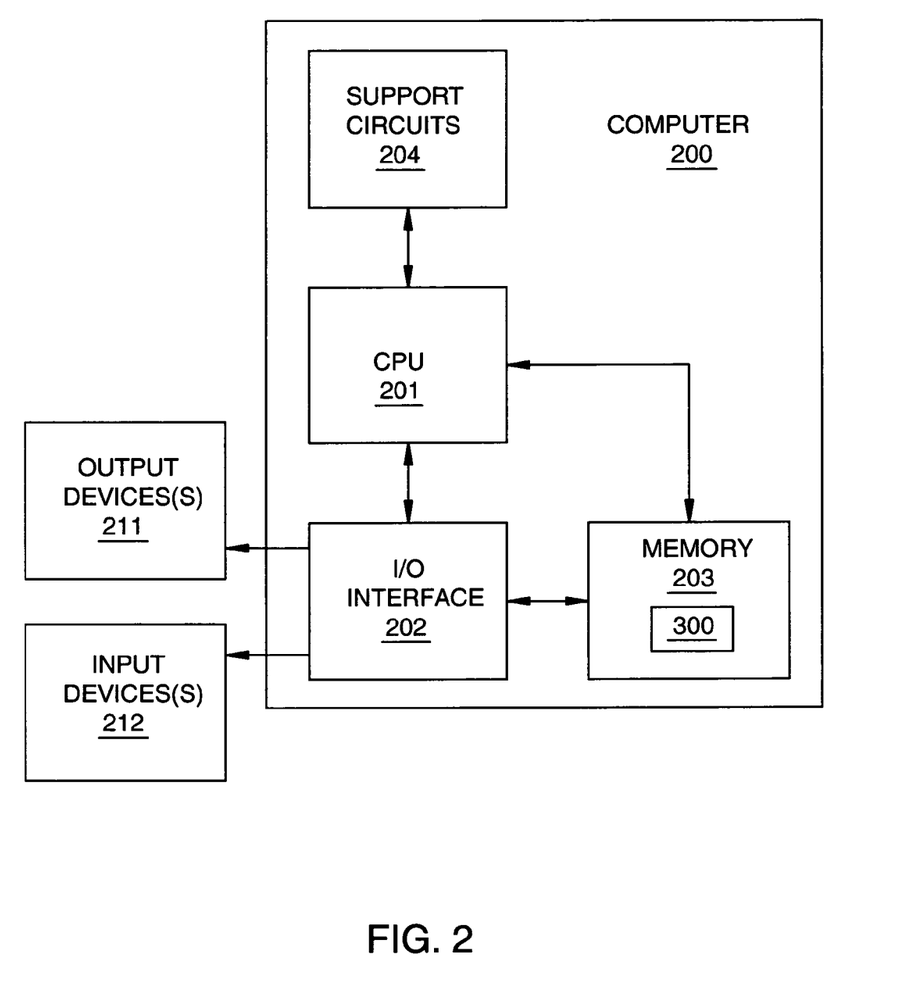
FIG. 2 is a block diagram depicting an exemplary embodiment of a computer suitable for implementing the processes and methods described herein.

FIG. 2 is a block diagram depicting an exemplary embodiment of a computer 200 suitable for implementing the processes and methods described herein. The computer 200 includes a central processing unit (CPU) 201, a memory 203, various support circuits 204, and an I/O interface 202. The CPU 201 may be any type of microprocessor known in the art. The support circuits 204 for the CPU 201 include conventional cache, power supplies, clock circuits, data registers, I/O interfaces, and the like. The I/O interface 202 may be directly coupled to the memory 203 or coupled through the CPU 201. The I/O interface 202 may be coupled to various input devices 212 and output devices 211, such as a conventional keyboard, mouse, printer, display, and the like.

The memory 203 may store all or portions of one or more programs and/or data to implement the processes, methods, and design tools described herein. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 200 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 203. The memory 203 may include one or more of the following: random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

Figure 3:
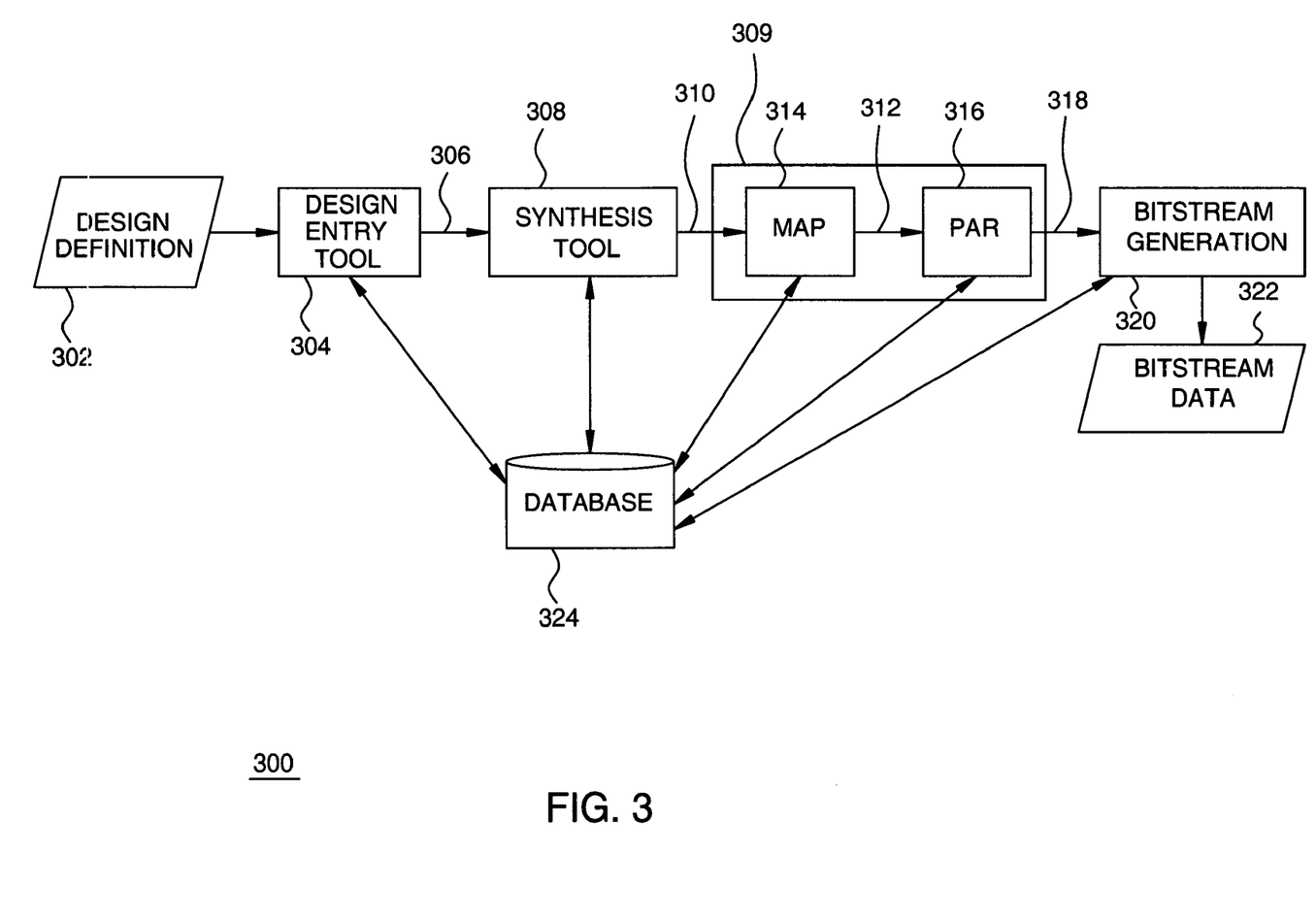
FIG. 3 is a block diagram depicting an exemplary embodiment of a design system for programmable logic devices (PLDs) in accordance with the invention.

FIG. 3 is a block diagram depicting an exemplary embodiment of a design system 300 for programmable logic devices (PLDs) in accordance with the invention. The design system 300 includes a design entry tool 302, a synthesis tool 308, an implementation tool 309, a bitstream generation tool 320, and a database 324. In the present embodiment, the implementation tool 309 comprises a map tool 314 and a place-and-route (PAR) tool 316. In another embodiment, the implementation tool 309 may further include the synthesis tool 308. Each of the tools 304, 308, 314, 316, and 320 has access to the database 324. The design system 300 may be implemented using the computer 200 shown in FIG. 2. Notably, the tools may be part of one or more software programs stored in the memory 203 and configured for execution by the CPU 201.

The design system 300 is configured to generate bitstream data 322 for a target FPGA device in response to a circuit design input by a user. In particular, the design entry tool 304 is configured to receive a design definition 302 and generate a functional description 306 of the circuit design. The design definition 302 includes a plurality of circuit elements, such as flip-flops, memories, LUTs, and the like, connected together via signal conductors ("nets" or "signals"). The term "elements" as used herein is meant to encompass both circuit elements and nets/signals.

The design entry tool 304 may include a graphic interface through which a designer connects symbols and blocks representing various components to produce a schematic description of the circuit design. The design entry tool 304 may also include a text interface through which a designer writes hardware description language (HDL) code to produce a structural and/or behavioral description of the circuit design in terms of HDL constructs. Examples of HDLs include the Very high-speed integrated circuit Hardware Description Language (VHDL) and VERILOG.

In one embodiment, the synthesis tool 308 is configured to receive the functional design data 306. The synthesis tool 308 processes the functional design data 306 to produce logical design data 310 (i.e., a logical representation of the circuit design). The logical design data 310 may include a logical network list ("netlist") supported by the target FPGA. For example, the synthesis tool 308 may process HDL code of the functional design data 306 to produce a netlist. The HDL synthesis process is well known in the art. In another embodiment, the design entry tool 304 produces the logical design data 310 directly. For example, the design entry tool 304 may produce a netlist for the target FPGA in response to a schematic description entered by the user.

The map tool 314 is configured to receive the logical design data 310 (e.g., netlist). The map tool 314 maps the logical design data 310 onto primitive components within the target FPGA (i.e., the blocks and signals of the design definition 302 are mapped onto CLBs, IOBs, etc. of the target FPGA). The map tool 314 produces mapped design data 312.

The PAR tool 316 is configured to receive the mapped design data 312. The PAR tool 316 places the primitive components within the target FPGA and routes interconnects (e.g., signal conductors of the programmable interconnect) for the placed components. The PAR tool 316 produces physical design data 318 for the target FPGA (i.e., a physical representation of the circuit design for the target FPGA). The bitstream generation tool 320 is configured to receive the physical design data 318. The bitstream generation tool 320 processes the physical design data 318 to produce the bitstream data 322 for the target FPGA. The bitstream data 322 may used to configure the FPGA with the design definition 302.

In one embodiment of the invention, one or more of the tools 304, 308, 314, 316, and 320 generate a project quality file along with respective output data. Each project quality file that is generated is stored separately in the database 324. For example, the synthesis tool 308 may generate a project quality file along with the logical design data 310, and the PAR tool 316 may generate another project quality file along with the physical design data 318. In another embodiment of the invention, each project quality file that is generated is stored as a single file or record in the database 324.

The project quality file includes statistical data, such as various design statistics, algorithm statistics, and global statistics. Design statistics that may be stored in a project quality file include, for example, the number of nets, the number of CLBs, the number of clocks, and the like that are used to implement the design definition 302. Algorithm statistics that may be stored in a project quality file include, for example, a number of iterations performed by a tool algorithm, the time taken to perform each of the iterations, the type and number of heuristics used in optimization performed by a tool algorithm, the relative improvement given by each phase of an algorithm executed by a tool, and the like. Global statistics that may be stored in a project quality file include, for example, the number of times a design was processed by the tool chain, the time elapsed during processing of a design by the tool chain, the number of errors that occurred during processing (e.g., user errors and/or tool errors), and the like.

For a given design tool, after a project quality file is created, the project quality file may be used in subsequent iterations to adjust operational attributes of the design tool. By automatically adjusting the operational attributes of the design tool, the design tool is capable of producing improved results with less run-time. The operational attributes of a tool include various input parameters and options for the tool, as well as behaviors of algorithms executed by the tool (which may be controlled by the input parameters and options). In addition, the statistical data collected from the tools may be used by a vendor to improve the tools. For example, the vendor may collect the statistical data from customers requiring support for the tools. The statistical data may provide information on how the tools are actually being used by the customers, as well as information on the type and complexity of circuit design currently being implemented.

For purposes of clarity by example, the design system 300 is configured to implement a circuit for an FPGA. Those skilled in the art will appreciate that the invention may be used with other types of design systems that comprise a chain of tools for implementing a circuit (e.g., tool chains for ASICs or CPLDs).

Figure 4:
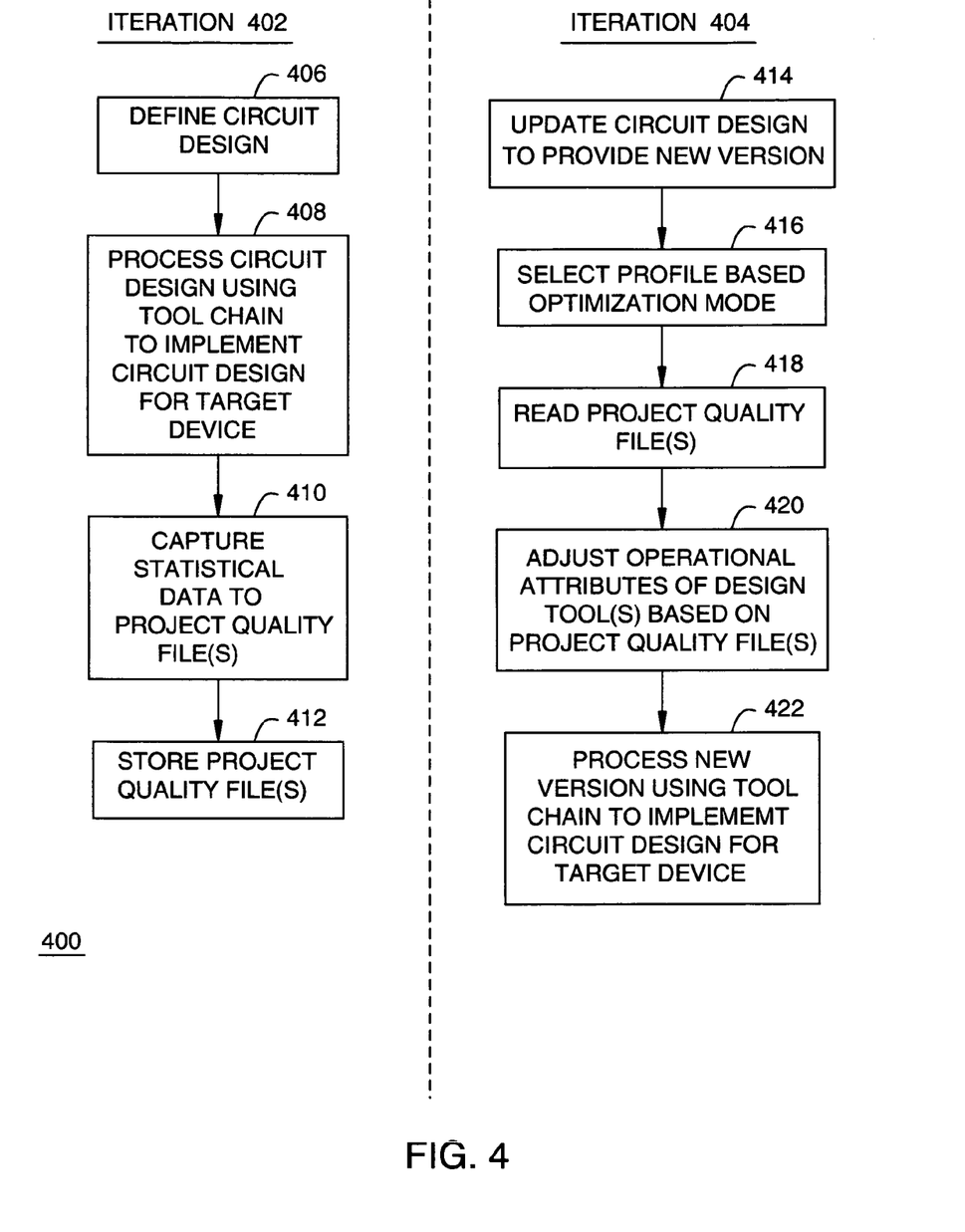
FIG. 4 is a flow diagram depicting an exemplary embodiment of a method for implementing a circuit design for an integrated circuit in accordance with the invention.

FIG. 4 is a flow diagram depicting an exemplary embodiment of a method 400 for implementing a circuit design for an integrated circuit in accordance with the invention. The method 400 may be performed using the design system 300 of FIG. 3. The method 400 comprises a first iteration 402 and a second iteration 404. The first iteration 402 begins at step 406, where a circuit design is defined. At step 408, the circuit design is processed using design tool chain to implement the circuit design for a target device. For example, the circuit design may be processed using the design system 300 to implement the circuit design for a target FPGA. At step 410, statistics are captured to one or more project quality files. For example, a project quality file may be created for each tool in the chain, or a single project quality file may be created for the entire tool chain. The captured statistics include one or more of design statistics, algorithm statistics, and global statistics related to the tools and the tool chain. At step 412, the project quality file(s) are stored in a storage device.

The second iteration 404 begins at step 414, where the circuit design is updated to produce a new version. For example, the user may edit the circuit design to produce the new version. At step 416, a profile-based optimization mode is selected. In profile-based optimization mode, the one or more tools in the tool chain process the circuit design with the project quality file(s) as parametric input.

In particular, at step 418, the project quality file(s) are read by one or more tools in the tool chain. At step 420, operational attributes of the tools are adjusted using the project quality file(s). At step 422, the new version of the circuit design is processed using the tool chain to implement the circuit design for the target device. In this manner, statistics captured during the processing of a first version of the circuit design are used to improve the results of processing a second version of the circuit design.

Figure 5:
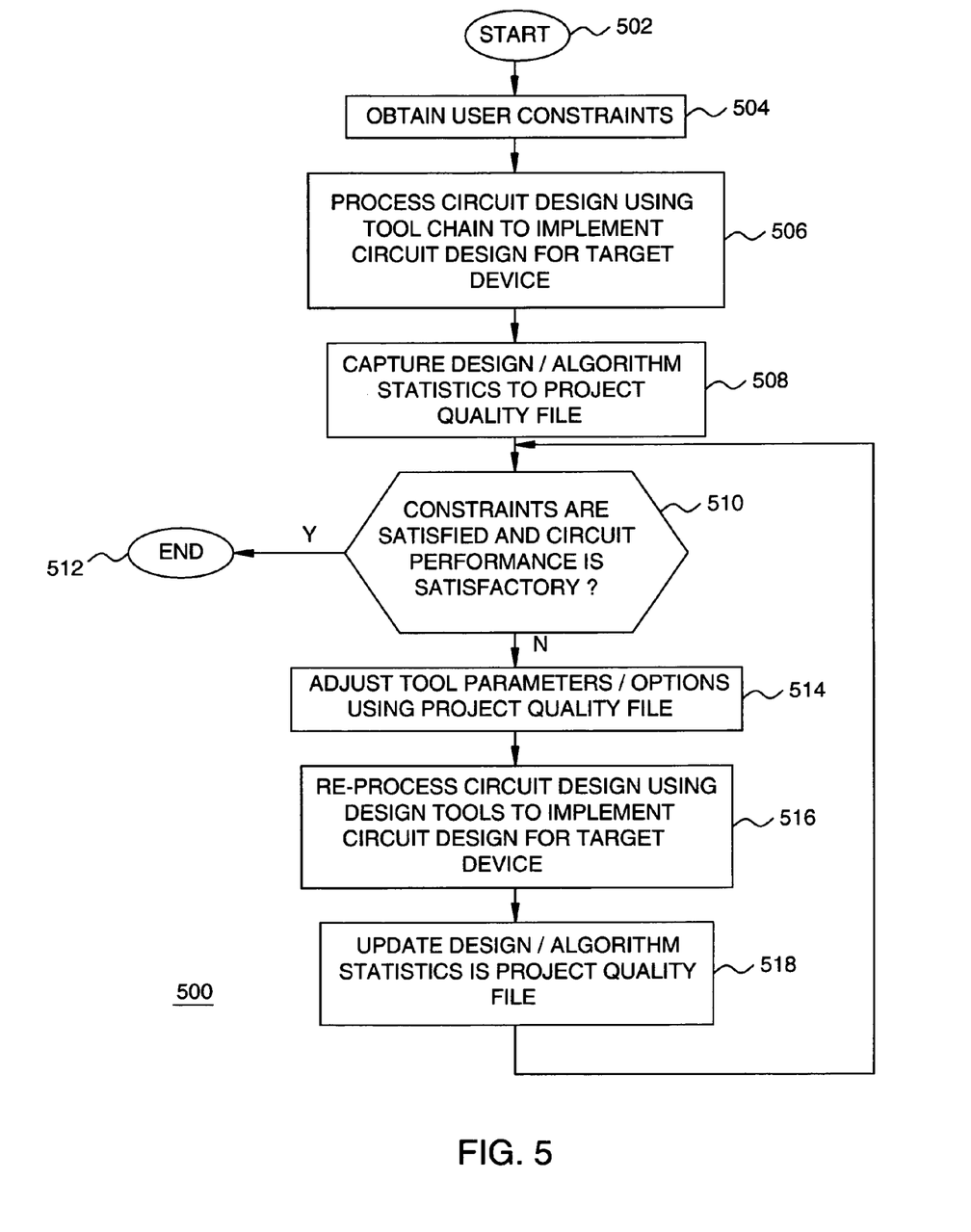
FIG. 5 is a flow diagram depicting another exemplary embodiment of a method for implementing a circuit design for an integrated circuit in accordance with the invention.

FIG. 5 is a flow diagram depicting another exemplary embodiment of a method 500 for implementing a circuit design for an integrated circuit in accordance with the invention. The method 500 may be performed using the design system 300 of FIG. 3. The method 500 begins at step 502. At step 504, user constraints are obtained. The user constraints may comprise various constraints associated with a circuit design, such as timing constraints, power constraints, and the like. At step 506, the circuit design is processed using a design tool chain to implement the circuit design for a target device. For example, the circuit design may be processed using the design system 300 to implement the circuit design for a target FPGA.

At step 508, statistics are captured to one or more project quality files. The captured statistics include one or more of design statistics, algorithm statistics, and global statistics, as well as design performance statistics and statistics on failed user constraints. At step 510, a determination is made as to whether the user constraints have been satisfied and the circuit performance is satisfactory. If so, the method 500 proceeds to end step 512. Otherwise, the method 500 proceeds to step 514. For example, a signal route in the implemented circuit may not satisfy a user's timing constraints. A user may also desire to improve the performance of the circuit design, regardless of user constraints.

At step 514, parameters/options for one or more tools in the tool chain are adjusted using the project quality file(s). At step 516, the circuit design is re-processed using the tool chain to implement the circuit design for the target device. At step 518, the statistics in the project quality file(s) are updated. That is, the statistics in the project quality files are updated in response to the re-processing by the tool chain. The method 500 returns to step 510 and may be repeated for additional iterations.

The method 500 may be understood with reference to the following example. During the first iteration (step 506), a PAR tool processing the circuit design may fail to route particular signals in a manner that satisfies user timing requirements. The PAR tool may then store statistical data in a project quality file relating to the signals that were not successfully routed. In the second iteration (step 516), the PAR tool reads the project quality file before processing the circuit design. Parameters/options of the PAR tool are set to adjust the behavior of the PAR tool in order to route the signals that failed to be routed in the first iteration in a manner that satisfies the user timing requirements. For example, the PAR tool may be configured to focus on placing objects that caused long signal routes in the first iteration and place such objects closer together during the second iteration. This could improve signal delay and help the PAR tool meet the user timing requirements.

Method and apparatus for implementing a circuit design for an integrated circuit has been described. One or more aspects of the invention relate to improving the results and run-time of a design tool chain for multiple cycles of a circuit design. In one embodiment, one or more tools in the tool chain are configured to generate statistical data for storage in a project quality file. In a subsequent iteration, a tool may use its project quality file to automatically adjust its input parameters/options, as well as its behaviors. In this manner, the invention obviates the need to manually evaluate the results from each individual tool in the chain and manually adjust tool parameters and options in the hopes of meeting design requirements. Such manual analysis and adjustment requires a good understanding of the design, a careful analysis of the failing portions of the design, and knowledge of the behavior of the tools in the chain. The profile-based optimization approach of the present invention reduces or eliminates the need to precisely understand tool behavior, since the tools will automatically modify their behavior based on the statistical data in the project quality file.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of implementing a circuit design for an integrated circuit, comprising:
   processing a first version of said circuit design with at least one design tool;
   capturing statistical data for said at least one design tool, said statistical data including algorithmic statistical data describing operation of algorithms performed by the at least one design tool;
   storing the statistical data in at least one protect quality file;
   automatically adjusting operational attributes of said at least one design tool in response to said statistical data in said at least one project quality file; and
   processing a second version of said circuit design with said at least one design tool having said adjusted operational attributes.

2. The method of claim 1, wherein said integrated circuit comprises a programmable logic device, and wherein said at least one design tool comprises at least one of a synthesis tool, a map tool, a place-and-route tool, and a bitstream generation tool.

3. The method of claim 2, wherein said statistical data further comprises at least one of design statistical data or global statistical data.

4. The method of claim 3, wherein said algorithmic statistical data comprises at least one of: a number of iterations performed by an algorithm, a time taken to perform each of said iterations, a type and a number of optimization heuristics employed by said algorithm, and metrics associated with a relative improvement over said iterations of results of said algorithm.

5. The method of claim 3, wherein said design statistical data comprises at least one of: a number of nets used by said circuit design, a number of programmable logic blocks used by said circuit design, and a number of clocks used by said circuit design.

6. The method of claim 3, wherein said global statistical data comprises at least one of: a number of times said circuit design was processed by said at least one design tool, at time taken to process said circuit design using said at least one design tool, and error data.

7. An apparatus for implementing a circuit design for an integrated circuit, comprising:
  means for processing a first version of said circuit design with at least one design tool;
  means for capturing statistical data for said at least one design tool, said statistical data including algorithmic statistical data derived from algorithms performed by the at least one design tool;
  means for storing the statistical data in at least one project quality file;
  means for automatically adjusting operational attributes of said at least one design tool in response to said statistical data in said at least one project quality file; and
  means for processing a second version of said circuit design with said at least one design tool having said adjusted operational attributes.

* * * * *